(12) United States Patent
Chiang et al.

(10) Patent No.: US 11,139,431 B2
(45) Date of Patent: Oct. 5, 2021

(54) HORIZONTAL MEMORY ARRAY STRUCTURE WITH SCAVENGER LAYER

(71) Applicant: Taiwan Semiconductor Manufacturing Co., Ltd., Hsin-Chu (TW)

(72) Inventors: Hung-Li Chiang, Taipei (TW); Chao-Ching Cheng, Hsinchu (TW); Tzu-Chiang Chen, Hsinchu (TW); Yu-Sheng Chen, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 44 days.

(21) Appl. No.: 16/394,177

(22) Filed: Apr. 25, 2019

(65) Prior Publication Data
US 2020/0343446 A1 Oct. 29, 2020

(51) Int. Cl.
*H01L 45/00* (2006.01)
*H01L 27/24* (2006.01)

(52) U.S. Cl.
CPC ...... *H01L 45/1273* (2013.01); *H01L 27/2427* (2013.01); *H01L 27/2481* (2013.01); *H01L 45/08* (2013.01); *H01L 45/146* (2013.01); *H01L 45/1616* (2013.01)

(58) Field of Classification Search
CPC ............. H01L 27/2427; H01L 45/1226; H01L 45/146; H01L 45/00–1691; G11C 13/0002–0097
See application file for complete search history.

(56) References Cited

U.S. PATENT DOCUMENTS

| 2014/0264229 A1* | 9/2014 | Yang | H01L 45/146 257/4 |
| 2014/0312296 A1* | 10/2014 | Jo | H01L 45/1226 257/4 |
| 2017/0141161 A1* | 5/2017 | Sakotsubo | H01L 45/1246 |

OTHER PUBLICATIONS

Hsu et al. "3D Vertical TaOx/TiO2RRAM With over 103 Self-Rectifying Ratio and Sub-μA Operating Current." 2013 IEEE International Electron Devices Meeting, published in Dec. 2013.

\* cited by examiner

*Primary Examiner* — Eric A. Ward
(74) *Attorney, Agent, or Firm* — Eschweiler & Potashnik, LLC

(57) ABSTRACT

Various embodiments of the present disclosure are directed towards a resistive random access memory (RRAM) device including a scavenger layer. A bit line overlying a semiconductor substrate. A data storage layer around outer sidewalls and a top surface of the bit line. A word line overlying the data storage layer. A scavenger layer between the word line and the bit line such that a bottom surface of the scavenger layer is aligned with a bottom surface of the bit line. A lateral thickness of the scavenger layer is less than a vertical thickness of the scavenger layer.

20 Claims, 13 Drawing Sheets

HORIZONTAL MEMORY ARRAY STRUCTURE WITH SCAVENGER LAYER

BACKGROUND

Many modern electronic devices contain electronic memory configured to store data. Electronic memory may be volatile memory or non-volatile memory. Volatile memory stores data only while it is powered, while non-volatile memory is able to keep data when power is removed. Resistive random access memory (RRAM) is one promising candidate for next generation non-volatile memory technology due to its simple structure and CMOS logic compatible process technology that is involved. An RRAM cell includes a dielectric data storage layer having a variable resistance, which is placed between two conductive wires.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
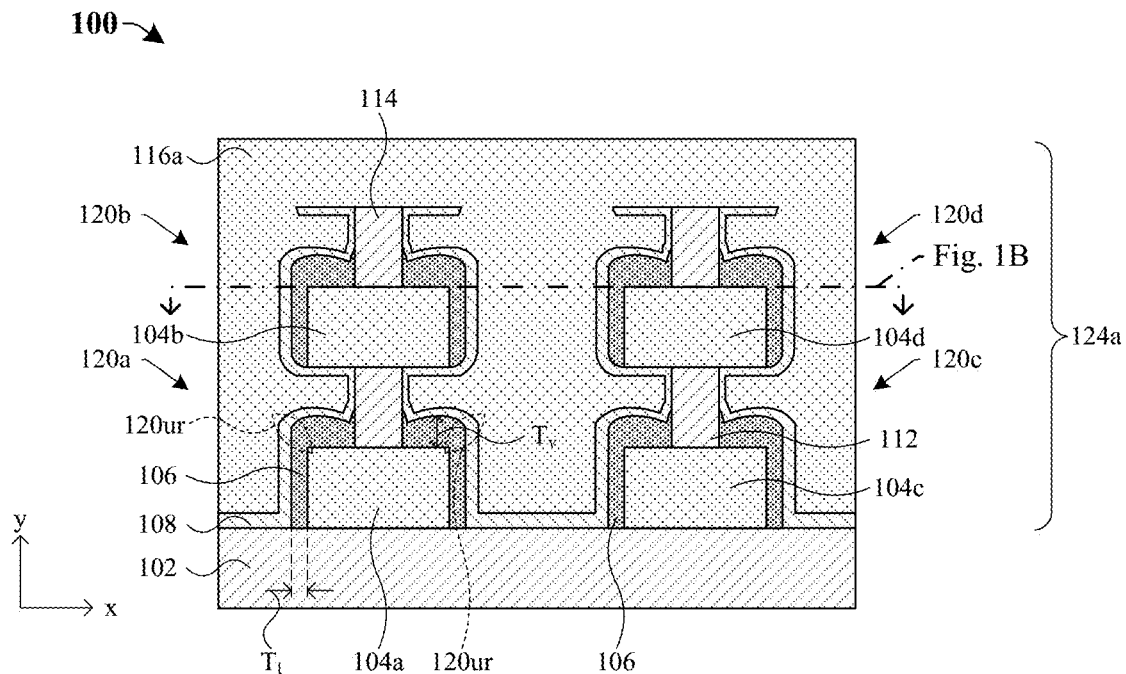
FIG. 1A illustrates a cross-sectional view of some embodiments of a memory device including a scavenger layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) cells may be disposed in a horizontal memory array. In a horizontal memory array, a first bit line overlies a second bit line respectively extending along in a first direction. The first bit line is separated from the second bit line by an isolation layer. A data storage layer overlies and surrounds the first bit line and the second bit line. A word line is disposed over the data storage layer along a second direction (where the first direction is orthogonal to the second direction) and extend downward along opposite sides of the first and second bit lines. Thus, the word line is separated from the first and second bit lines by the data storage layer. Thus, a first RRAM cell is defined by the first bit line, the data storage layer, and the word line. Additionally, a second RRAM cell is defined by the second bit line, the data storage layer, and the word line.

Depending on a voltage applied to the first bit line and the word line, a portion of the dielectric data storage layer (sandwiched between the first bit line and the word line) will undergo a reversible change (e.g., form or remove a conductive filament in the data storage layer). The reversible change may be between a high resistance state associated with a first data state (e.g., a '0' or 'RESET') and a low resistance state associated with a second data state (e.g., a '1' or 'SET'). Once a resistance state is set, the first RRAM cell will retain the resistive state until another voltage is applied to induce a RESET operation (resulting in a high resistance state) or a SET operation (resulting in a low resistance state). A same operation may be carried out between the second bit line and the word line, thereby changing a resistance state of the second RRAM cell. Due to the straight outer sidewalls of the pillar structure and the rectangular shape of the first and second bit lines, an electric field between the first bit line and the word line is substantially uniform over the entirety of the outer sidewalls. The substantially uniform electric field makes the location of the conductive filament variable and/or unpredictable for different write operations, thereby reducing distinct data states, stability, and/or reliability of the memory device.

In some embodiments of the present disclosure, to eliminate the uniform electric field between the first bit line and the world line, a conductive scavenger layer may be formed between the first bit line and the word line. The conductive scavenger layer is configured to direct the electric field to an upper region (e.g., an upper corner) between a top surface of the first bit line and the word line, thereby distorting the uniformity of the electric field and facilitating a maximum magnitude of the electric field in the upper region (thereby confining the conductive filament to the upper region). This, in part, makes the location, conductivity, and/or predictability of the conductive filament more consistent, thereby increasing distinct data states, stability, and reliability of the memory device. Further, the conductive scavenger layer comprises a scavenger material (e.g., titanium nitride) configured to "scavenge" (i.e., collect, absorb, and/or store) a reactive species (e.g., oxygen) from the data storage layer. This, in part, further improves formation and/or conductivity of the conductive filament, thereby further increasing distinct data states, stability, and reliability of the memory device.

Referring to FIG. 1A, a cross-sectional view of a memory device 100 including memory cells 120a-d in accordance with some embodiments is provided.

The memory device 100 includes four bit lines 104a-d, such that a first bit line 104a underlies a second bit line 104b, and a third bit line 104c underlies a fourth bit line 104d. The first and second bit lines 104a-b, and the third and fourth bit lines 104c-d are respectively separated from one another by lower isolation structures 112. Upper isolation structures 114 isolate the second and fourth bit lines 104b, 104d from an overlying first word line 116a. The bit lines 104a-d and the first word line 116a define a first column 124a of the memory device 100. The bit lines 104a-d respectively extend in a first direction (e.g., into the page along the z-axis), the first word line 116a extends in a second direction (e.g., along the x-axis), such that the first direction is orthogonal to the second direction. The bit lines 104a-d overlie an interconnect dielectric structure 102. In some embodiments, the bit lines 104a-d overlie and are electrically coupled to semiconductor devices (e.g., transistors) disposed on an underlying semiconductor substrate (not shown). A scavenger layer 106 extends in the first direction along sidewalls and an upper surface of each bit line 104a-d. A data storage layer 108 continuously extends around the bit lines 104a-d and the scavenger layer 106, such that the scavenger layer 106 and the data storage layer 108 are sandwiched between each bit line 104a-d and the first word line 116a.

In some embodiments, the first column 124a of the memory device 100 includes memory cells 120a-d respectively configured as resistive random-access memory (RRAM) cells. Each memory cell 120a-d is defined by a bit line (e.g., one of the bit lines 104a-d), the scavenger layer 106, the data storage layer 108, and the first word line 116a. For example, a first memory cell 120a is defined by the first bit line 104a, the first word line 116a, and the layers (the scavenger layer 106 and the data storage layer 108) disposed between the first bit and word lines 104a, 116a. A second memory cell 120b is defined by the second bit line 104b, the first word line 116a, and the layers (the scavenger layer 106 and the data storage layer 108) disposed between the aforementioned lines. A third memory cell 120c is defined by the third bit line 104c, the first word line 116a, and the layers (the scavenger layer 106 and the data storage layer 108) disposed between the aforementioned lines. A fourth memory cell 120d is defined by the fourth bit line 104d, the first word line 116a, and the layers (the scavenger layer 106 and the data storage layer 108) disposed between the aforementioned lines.

In some embodiments, the bit lines 104a-d and first word line 116a are electrically coupled to support circuitry (e.g., transistors, diodes, microcontrollers, any combination of the aforementioned, etc.) configured to selectively apply formation, read, and/or write signals. The first word line 116a defines the first column 124a and each bit line 104a-d defines a separate row in a memory array. Consequently, by providing suitable bias conditions to the first word line 116a and the first bit line 104a an electrical resistance of the data storage layer 108 between the first bit and word lines 104a, 116a may be switched. Thus, the first memory cell 120a may be switched between a first state with low resistance (a conductive filament is made in the data storage layer 108 between the first bit and word lines 104a, 116a) and a second state with a high resistance (at least a portion of the conductive filament is unmade in the data storage layer 108), or vice versa to store data. The memory cells 120b-d may each be switched between the first and second states as described above.

During operation of the memory device 100, the scavenger layer 106 is configured to manipulate a strength of an electrical field due to the bias conditions. A lateral thickness $T_l$ of the scavenger layer 106 is less than a vertical thickness $T_v$ of the scavenger layer 106. This, in part, directs a maximum strength of the electric field around the first bit line 104a and the scavenger layer 106 to an upper region 120ur of the first memory cell 120a. Thus, during a formation and/or write operation, the conductive filament in the data storage layer forms in the upper region 120ur, thereby increasing stability, reliability, and distinct data states in each memory cell 120a-d of the memory device 100. In some embodiments, the conductive filament is confined to the upper region 120ur, such that the conductive filament does not form along outer sidewalls of the scavenger layer 106.

In some embodiments, the lateral thickness $T_1$ is, for example, within a range of about 3 to 5 nanometers. The vertical thickness $T_v$ is, for example, within a range of about 5 to 8 nanometers. The vertical thickness $T_v$ is, for example, approximately 1.2 to 1.6 times greater than the lateral thickness $T_1$. For example, the vertical thickness $T_v$ may be 1.2 times greater than the lateral thickness $T_1$. In some embodiments, if the vertical thickness $T_v$ is 1.2 times or greater than the lateral thickness $T_1$, then the maximum strength of the electric field is directed to the upper region 120ur. In further embodiments, if the vertical thickness $T_v$ is 1.6 times or less than the lateral thickness $T_1$, then the maximum strength of the electric field is directed to the upper region 120ur without electrically shorting the first bit line 104a to the second bit line 104b.

In some embodiments, the data storage layer 108 may have any composition suitable for the data storage layer of an RRAM cell. A material suitable for the data storage layer of an RRAM cell is one that can be induced to undergo a reversible phase change between a high resistance state and a low resistance state. In some embodiments, the change is between an amorphous state (i.e., no presence of a conductive filament in the data storage layer 108) and a metallic state (i.e., presence of a conductive filament in the data storage layer 108). The phase change can be accompanied by or associated with a change in molecular structure. For example, an amorphous metal oxide may lose oxygen as it undergoes a phase change to a metallic state (thereby forming the conductive filament). The oxygen may be stored in a portion of the data storage layer 108 that remains in the amorphous state or in an adjacent layer (e.g., the scavenger layer 106). Although described as a dielectric, only the low resistance state need be a dielectric. In most embodiments, the data storage layer 108 is a high-k dielectric while in the low resistance state. In some embodiments, the data storage layer 108 is a transitional metal oxide. Examples of materials that can be suitable for data storage layer 108 include nitric oxide, tantalum oxide, titanium oxide, hafnium oxide, tungsten oxide, zirconium oxide, and/or aluminum oxide.

In some embodiments, the bit lines 104a-d and/or the first word line 116a may, for example, be or comprise titanium, tantalum, titanium nitride, tantalum nitride, tungsten, ruthenium, zirconium, platinum, aluminum nickel, or the like. In some embodiments, the bit lines 104a-d may respectively comprise a first material different than a second material the first word line 116a is comprise of. Further, the scavenger layer 106 may, for example, be or comprise titanium nitride, tantalum nitride, titanium, tantalum, or the like. The data storage layer 108 may, for example, be or comprise gold and/or hafnium oxide, copper and hafnium oxide, aluminum and hafnium oxide, arsenic and hafnium oxide, gold tellurium and hafnium oxide, silicon oxide, titanium oxide, aluminum oxide (e.g., $Al_2O_3$), tantalum oxide, zirconium oxide, or the like. Therefore, the scavenger layer 106 comprises a conductive material different than the bit lines 104a-d and/or the first word line 116a. Further, by virtue of the conductive material (of the scavenger layer 106), the scavenger layer 106 is configured to "scavenge" (i.e., collect, absorb, and/or store) a reactive species (e.g., oxygen) from the data storage layer 108. This, in part, enhances formation of the filament in the data storage layer 108, thereby further increasing stability, reliability, and distinct data states in each memory cell 120a-d of the memory device 100.

Figure 1B:
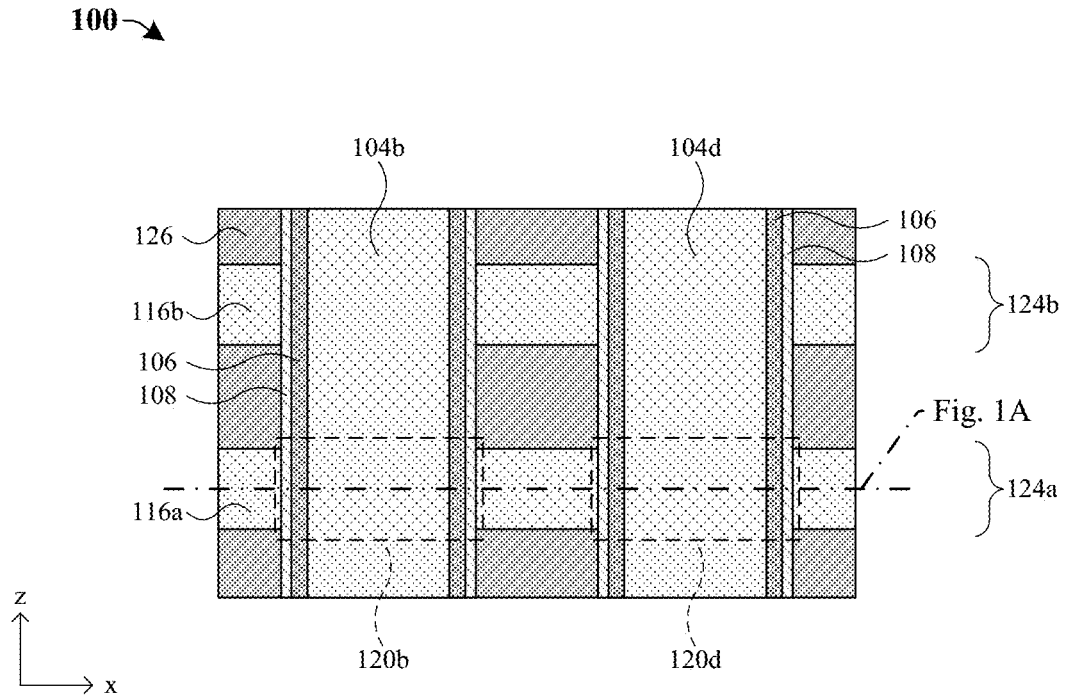
FIG. 1B illustrates a top view of the memory device of FIG. 1A, as indicated by the cut-line in FIG. 1A.

Referring to FIG. 1B, a top view corresponding to some embodiments of the memory device 100 of FIG. 1A, as indicated by the cut-away lines shown in FIGS. 1A-1B is provided.

The second and fourth bit lines 104b, 104d, the scavenger layers 106, and the data storage layers 108 respectively extend in the first direction (e.g., along the z-axis). The first word line 116a and a second word line 116b respectively extend in the second direction (e.g., the x-axis), such that the first direction is orthogonal to the second direction. In some embodiments, the second and fourth bit lines 104b, 104d, the scavenger layers 106, the data storage layers 108, and the first and second word lines 116a-b respectively have a bottom surface that is parallel to a top surface of an underlying semiconductor substrate (not shown). The second and fourth bit lines 104b, 104d, underlying first and third bit lines (104a, 104c of FIG. 1A), and the second word line 116b define a second column 124b of the memory device 100. The first column 124a comprises four memory cells (120a-d of FIG. 1A) and the second column 124b comprises four memory cells (not shown), such that the memory device 100 comprises a total of eight memory cells. The memory cells within the second column 124b are respectively configured as the first memory cell (120a of FIG. 1A). The first and second word lines 116a, 116b are laterally separated from one another by an upper inter-metal dielectric (IMD) structure 126. The second and fourth bit lines 104b, 104d are laterally separated from one another by the upper IMD structure 126.

Although FIGS. 1A-1B describe the memory cells (e.g., memory cells 120a-d of FIG. 1A) in the memory device 100 as being resistive random access memory (RRAM) cells, it will be appreciated that the memory cells (e.g., memory cells 120a-d of FIG. 1A) are not limited to such devices. Rather, in alternative embodiments, the memory cells (e.g., memory cells 120a-d of FIG. 1A) may comprise phase-change random-access memory (PCRAM) cells, magnetoresistive random-access memory (MRAM) cells, conductive bridging random access memory (CBRAM) cells, or the like. In such embodiments, the memory cells can be formed to direct a maximum strength of the electric field around the bit line to an upper region located at top corners of the bit line.

In some embodiments, if the memory cells are respectively MRAM cells, then each MRAM cell may comprise a free layer, a tunneling barrier layer, a reference layer, and/or a fixed layer. In the aforementioned embodiment, the free layer may, for example, be or comprise cobalt iron, cobalt iron boron, cobalt iron tantalum, cobalt iron boron tantalum, tungsten, ruthenium, or the like. The tunneling barrier layer may, for example, be or comprise magnesium oxide, aluminum oxide, or the like. The reference layer may, for example, be or comprise cobalt iron, cobalt iron boron, cobalt iron tantalum, cobalt iron boron tantalum, tungsten, ruthenium, or the like. The fixed layer may, for example, be or comprise cobalt platinum ruthenium, cobalt platinum iridium, or the like.

In some embodiments, if the memory cells are respectively CBRAM cells, then the first word line 116a may, for example, be or comprise gold, copper, gold tellurium, copper tellurium, or the like. In the aforementioned embodiments, the data storage layer 108 may, for example, be or comprise hafnium oxide, tantalum oxide, titanium oxide, zirconium oxide, hafnium zirconium oxide, hafnium titanium oxide, or the like. In further embodiments, if the memory cells are respectively PCRAM cells, then the bit lines 104a-d and/or the first word line 116a may respectively, for example, be or comprise titanium, tantalum, titanium nitride, tantalum nitride, tungsten, carbon, or the like. In the aforementioned embodiment, the data storage layer 108 may, for example, be or comprise germanium antimony tellurium, germanium tellurium, germanium antimony, antimony tellurium, or the like.

Figure 2A:
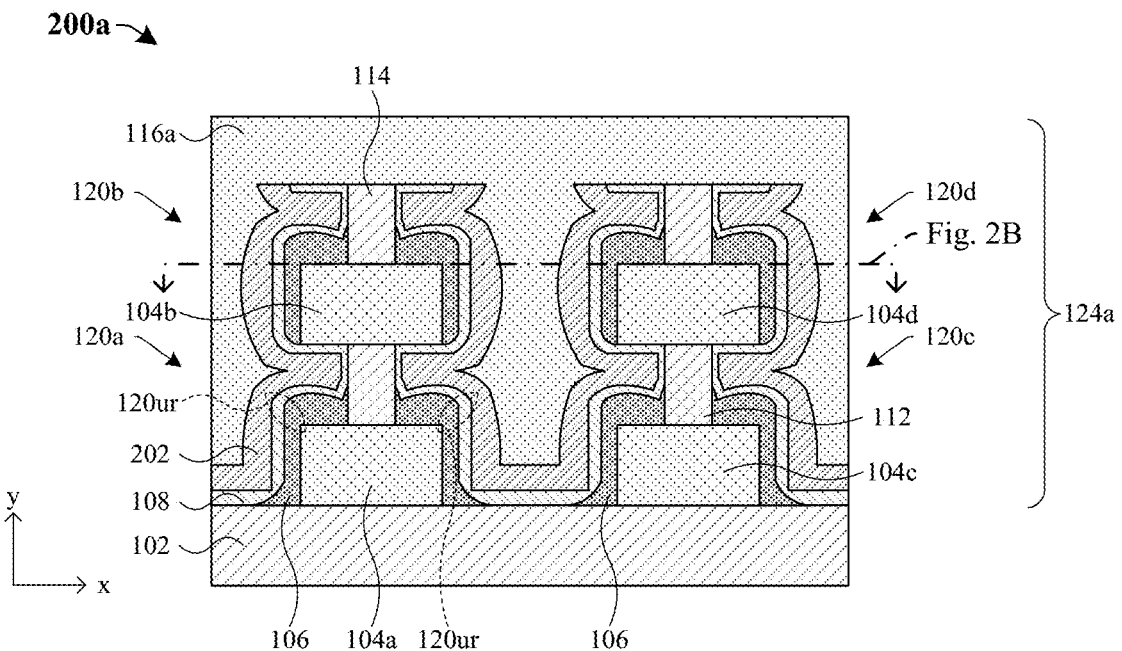
FIGS. 2A, 2C, and 2D illustrate cross-sectional views of some alternative embodiments of the memory device of FIG. 1A.

Referring to FIG. 2A, a cross-sectional view of a memory device 200a corresponding to some alternative embodiments of the memory device 100 of FIG. 1A is provided.

The memory device 200a includes a selector layer 202 disposed between the data storage layer 108 and the first word line 116a, such that the first memory cell 120a includes the first bit line 104a, the first word line 116a, and the layers (the scavenger layer 106, the data storage layer 108, and the selector layer 202) sandwiched between the first bit and word lines 104a, 116a. The memory cells 120b-d are respectively configured as the first memory cell 120a. The selector layer 202 is configured to switch between a low resistance state and a high resistance state depending on whether a voltage applied across the selector layer 202 is greater than a threshold voltage. For example, the selector layer 202 may have a high resistance state if a voltage cross the selector layer 202 is less than the threshold voltage, and the selector layer 202 may have a low resistance state if a voltage across the selector layer 202 is greater than the threshold voltage. In some embodiments, the threshold voltage may, for example, be within a range of about 0.1 to 0.6 volts (V). In some embodiments, an operational voltage (i.e., a voltage that may be applied to form the conductive filament in the data storage layer 108) of the data storage layer 108 may, for example, be within a range of about 0.5 to 2 V. The threshold voltage of the selector layer 202 may, for example, be less than the operational voltage of the data storage layer 108. In some embodiments, the memory device 200a is a part of a cross-point memory array, such that the memory cells 120a-d are respectively configured as one-resistor one-selector (IRIS) cells.

Figure 2B:
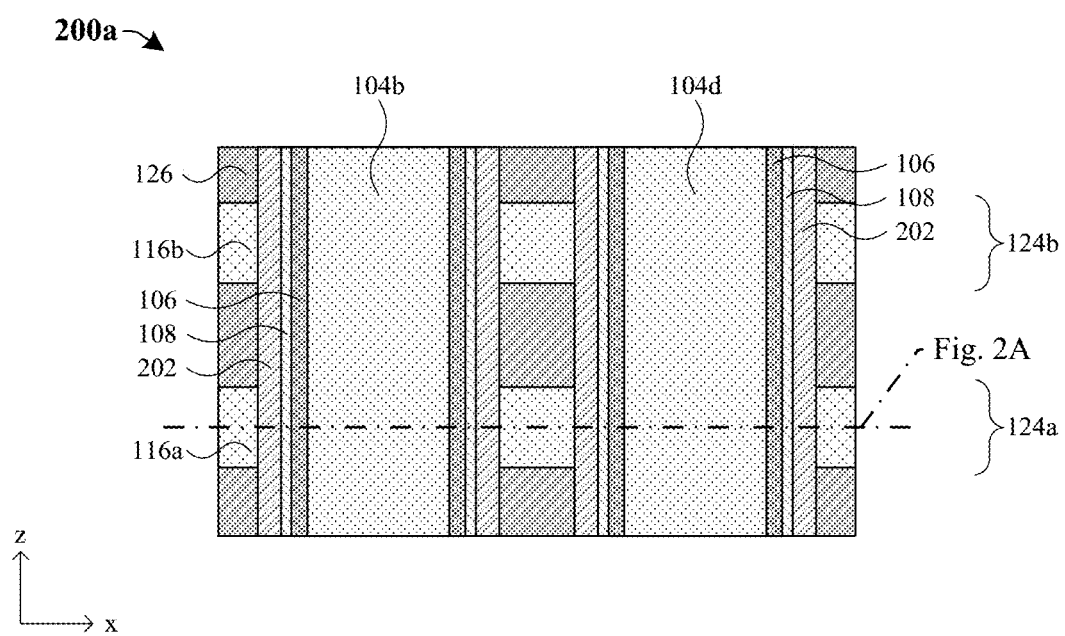
FIG. 2B illustrates a top view of the memory device of FIG. 2A, as indicated by the cut-line in FIG. 2A.

Referring to FIG. 2B, a top view corresponding to some embodiments of the memory device 200a of FIG. 2A, as indicated by the cut-away lines shown in FIGS. 2A-2B is provided.

The selector layer 202 extends in the first direction (e.g., along the z-axis) orthogonal to the second direction (e.g., along the x-axis). In some embodiments, a bottom surface of the selector layer 202 is parallel to a top surface of an underlying semiconductor substrate (not shown).

Figure 2C:
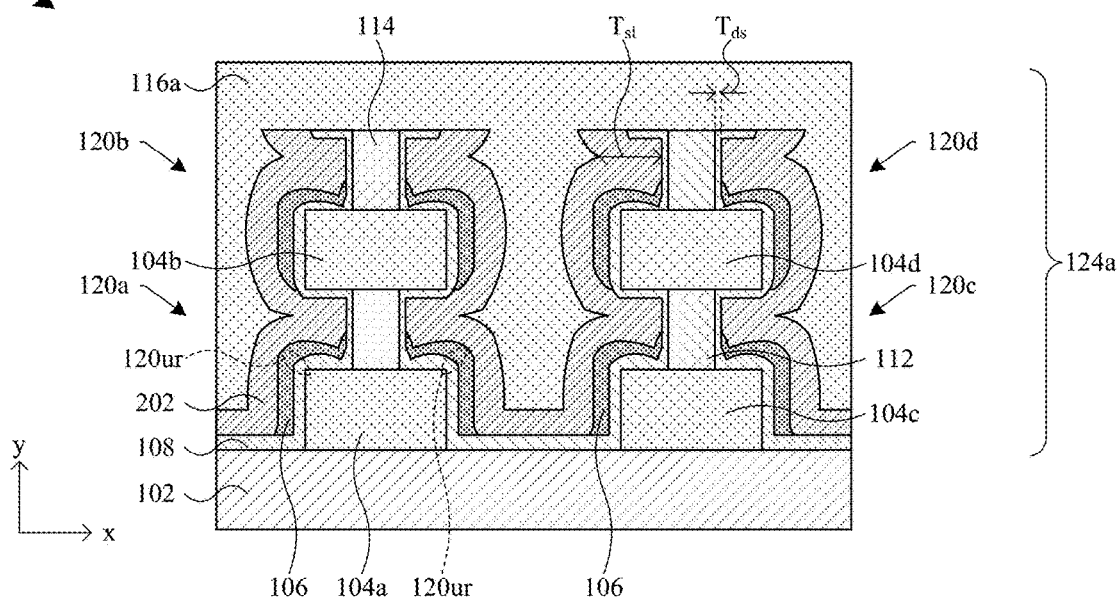

Referring to FIG. 2C, a cross-sectional view of a memory device 200c corresponding to some alternative embodiments of the memory device 200a of FIG. 2A is provided. The scavenger layer 106 is sandwiched between the data storage layer 108 and the selector layer 202. The data storage layer 108 directly contacts and extends along outer sidewalls of the first bit line 104a and a top surface of the first bit line 104a. In some embodiments, the scavenger layer 106 is configured to confine a formation and/or removal of a conductive filament in the data storage layer 108 within the upper region 120ur. A thickness $T_{sl}$ of the selector layer 202 is greater than a thickness $T_{ds}$ of the data storage layer 108. In some embodiments, a maximum value of the thickness $T_{sl}$ is at least two times greater than a maximum value of the thickness $T_{ds}$.

Figure 2D:
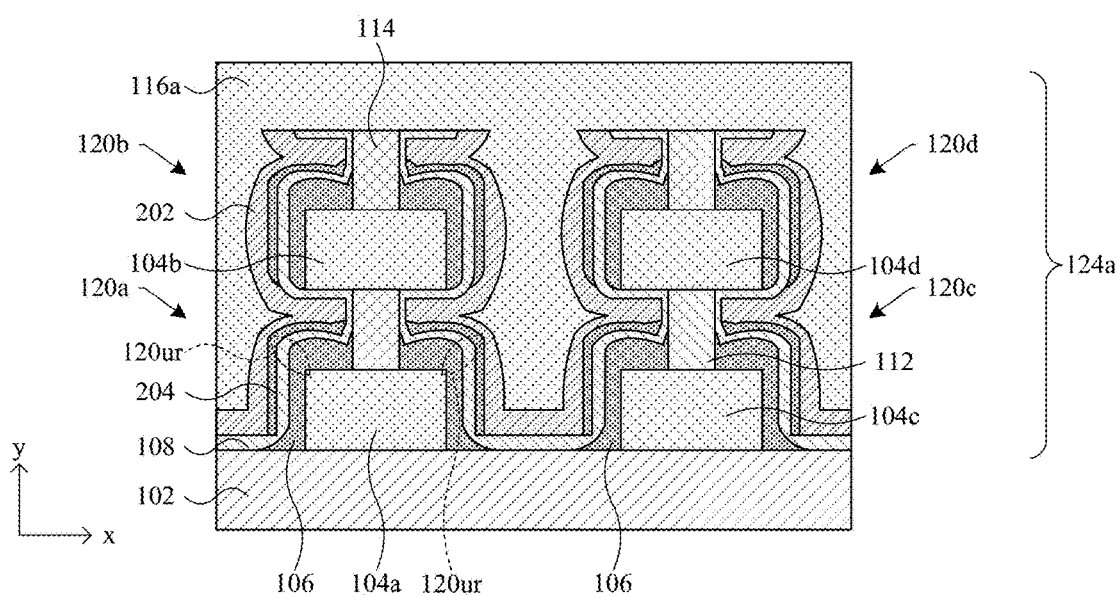

Referring to FIG. 2D, a cross-sectional view of a memory device 200d corresponding to some alternative embodiments of the memory device 200a of FIG. 2A is provided.

An outer scavenger layer 204 is disposed between the data storage layer 108 and the selector layer 202. In some embodiments, the outer scavenger layer 204 comprises a same material as the scavenger layer 106. The outer scavenger layer 204 is configured to "scavenge" (i.e., collect, absorb, and/or store) oxygen from the data storage layer 108, thereby further increasing stability, reliability, and distinct data states in each memory cell 120a-d of the memory device 100. Further, the outer scavenger layer 204 enhances direction of the electric field to the upper region 120ur, thereby further increasing stability, reliability, and distinct data states in each memory cell 120a-d of the memory device 100.

Figure 3A:
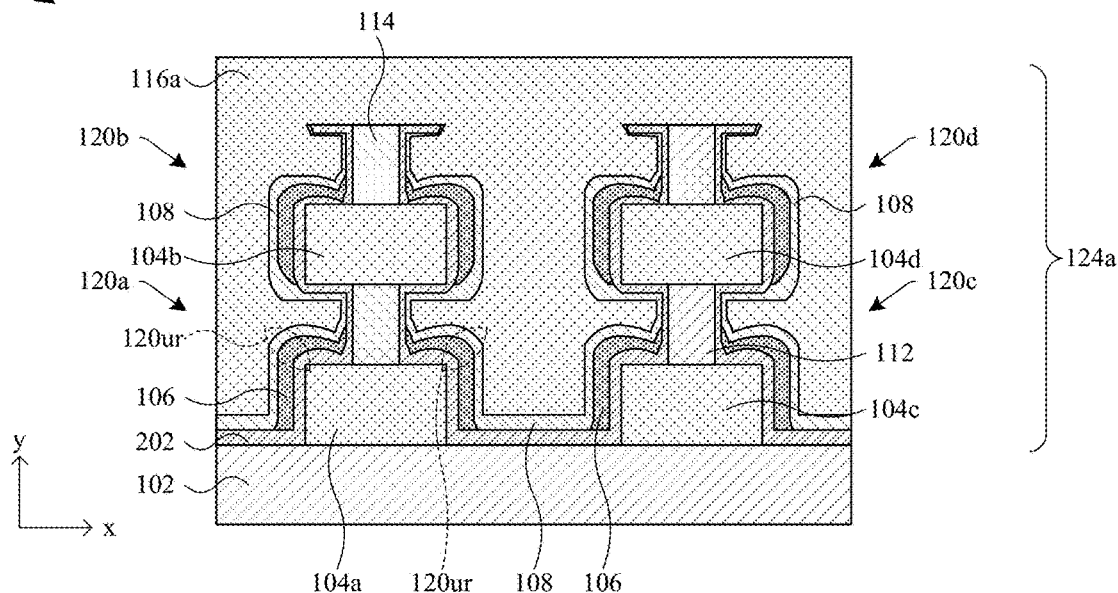
FIGS. 3A and 3B illustrate cross-sectional views of some alternative embodiments of the memory device of FIG. 1A.

Referring to FIG. 3A, a cross-sectional view of a memory device 300a corresponding to some alternative embodiments of the memory device 200a of FIG. 2A is provided. The selector layer 202 directly contacts the bit lines 104a-d, the lower isolation structure 112, and the upper isolation structure 114. The scavenger layer 106 directly contacts the selector layer 202 and is disposed between the selector layer 202 and the data storage layer 108. The data storage layer 108 directly contacts the first word line 116a.

Figure 3B:
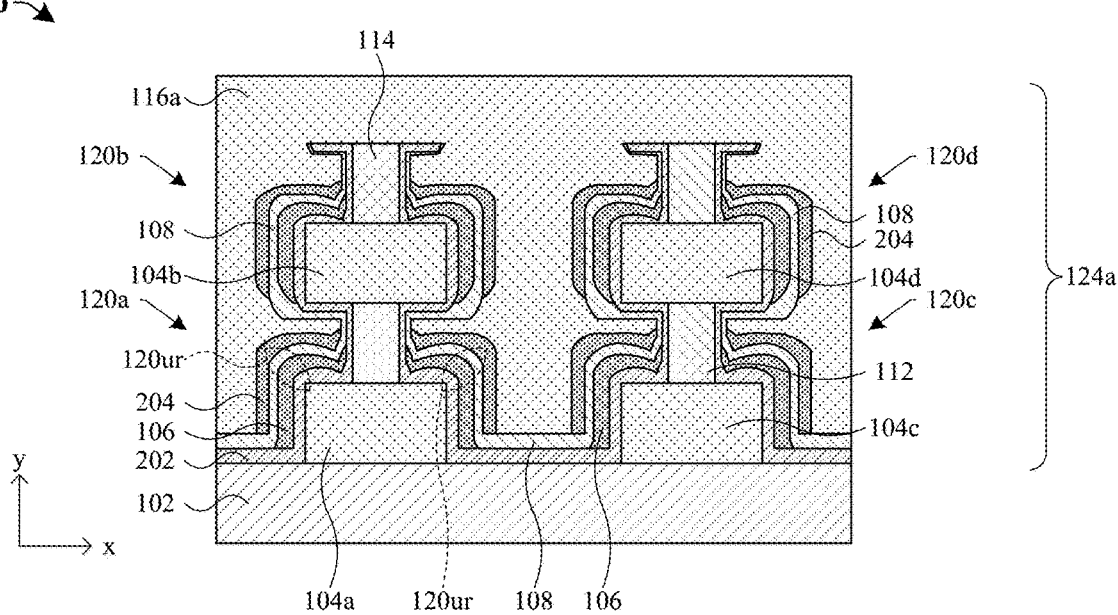

Referring to FIG. 3B, a cross-sectional view of a memory device 300b corresponding to some alternative embodiments of the memory device 300a of FIG. 3A is provided, in which an outer scavenger layer 204 is disposed between the data storage layer 108 and the first word line 116a.

Figure 4:
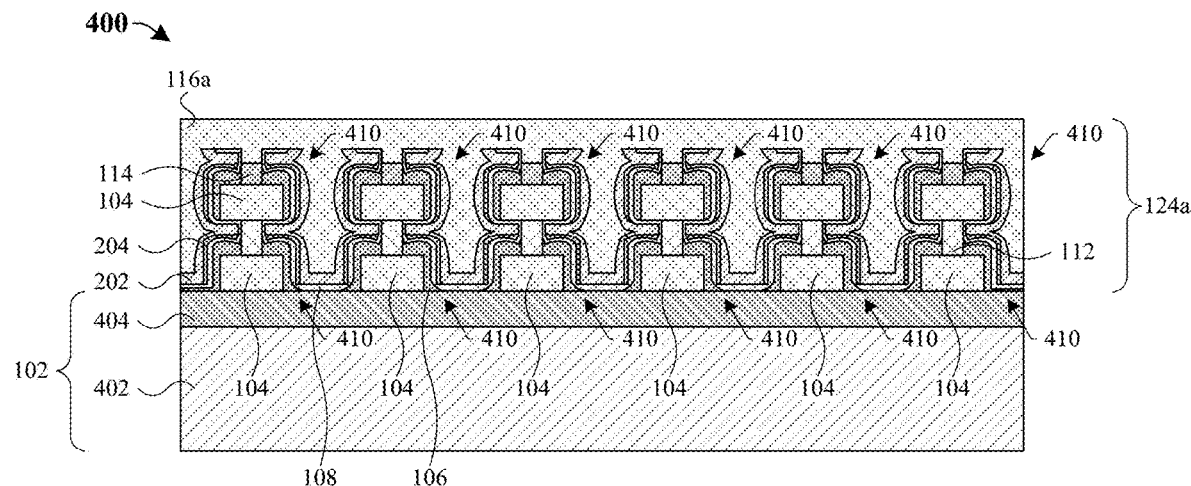
FIG. 4 illustrates a cross-sectional view of some embodiments of a memory device including twelve memory cells.

Referring to FIG. 4, a cross-sectional view of a memory device 400 is provided, in which memory cells 410 are respectively configured as the first memory cell 120a of FIG. 2D. The memory device 400 comprises twelve bit lines 104 and twelve memory cells 410. The upper isolation structure 114 may, for example, comprise silicon nitride, silicon carbide, or the like. In some embodiments, the upper isolation structure 114 comprises a dielectric material different than the lower isolation structure 112. The interconnect dielectric structure 102 comprises a metal etch stop layer 404 overlying an inter-level dielectric (ILD) layer 402.

Figure 5:
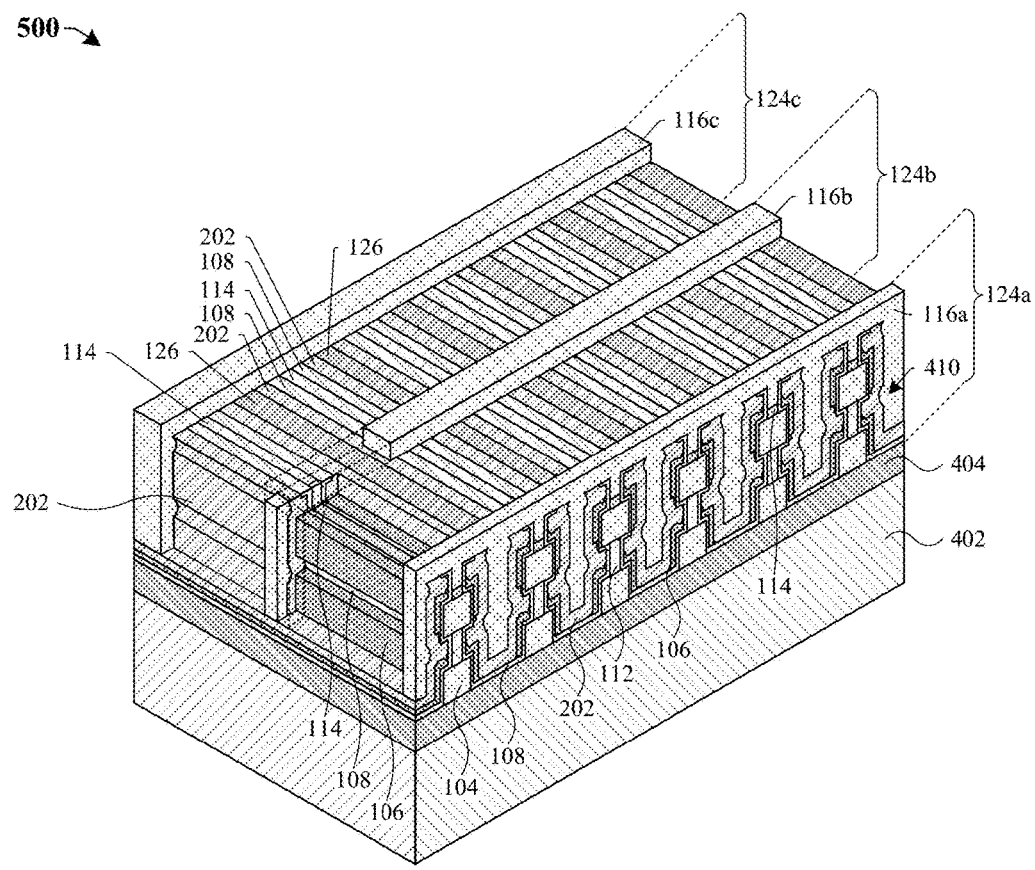
FIG. 5 illustrates a perspective view of some embodiments of a memory device with some portions cut-away including thirty-six memory cells.

Referring to FIG. 5, a perspective view with some portions cut-away of a memory device 500 including thirty-six memory cells 410 is provided, in which the memory cells 410 are respectively configured as the first memory cell 120a of FIG. 2C. The memory device 500 includes twelve rows (corresponding to the twelve bit lines 104) and three columns 124a-c (corresponding to the three word lines 116a-c). In some embodiments, twelve bit lines 104 extend along a first direction and three word lines 116a-c extend along a second direction, such that the first direction is orthogonal to the second direction. Portions of the second word line 124b and the leftmost rows have been cut-away to better illustrate some underling features of the device.

FIGS. 6-19 illustrate cross-sectional views 600-1900 of some embodiments of a method of forming a memory device including memory cells according to the present disclosure. Although the cross-sectional views 600-1900 shown in FIGS. 6-19 are described with reference to a method, it will be appreciated that the structures shown in FIGS. 6-19 are not limited to the method but rather may stand alone separate of the method. Although FIGS. 6-19 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
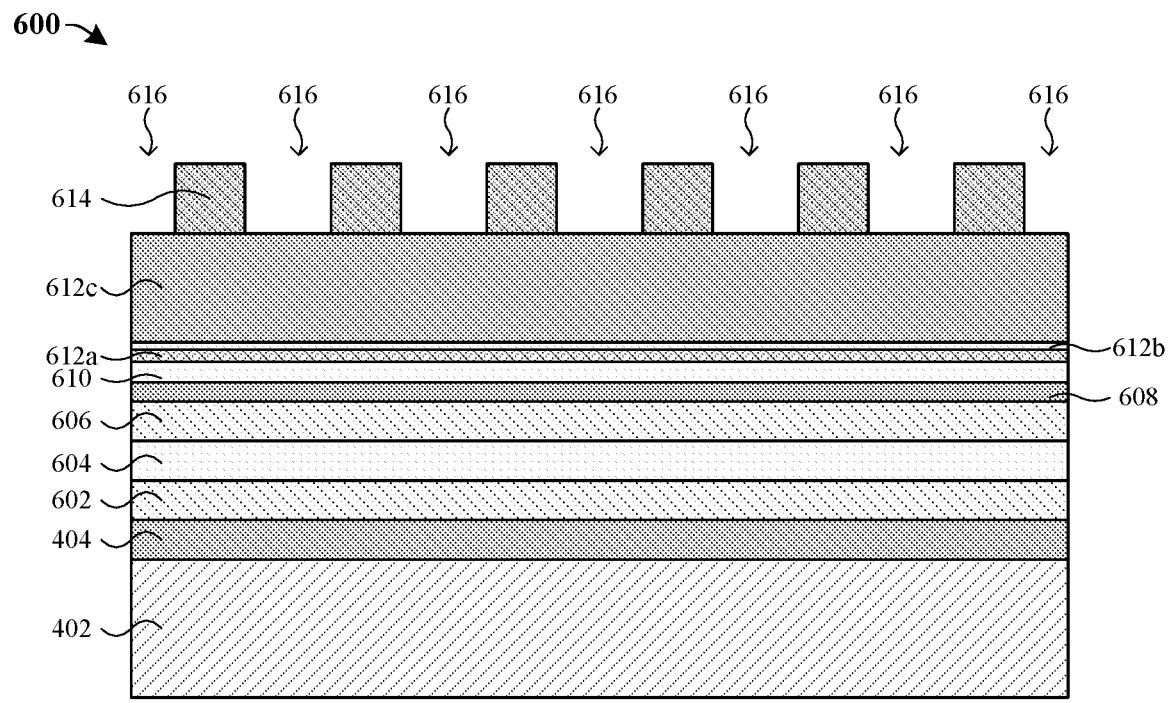
FIGS. 6-19 illustrate cross-sectional views of some embodiments of a method of forming a memory device including twelve memory cells.

As shown in cross-sectional view 600 of FIG. 6, a metal etch stop layer 404 is formed over an inter-level dielectric (ILD) layer 402. In some embodiments, the ILD layer 402 is a part of an interconnect structure comprising multiple layers of metal lines with conductive vias disposed between the multiple layers of metal lines (not shown). In some embodiments, the ILD layer 402 overlies a semiconductor substrate comprising a plurality of semiconductor devices (e.g., transistors) disposed over the semiconductor substrate (not shown). A lower bit line layer 602 is formed over the metal etch stop layer 404. A lower isolation layer 604 is formed over the lower bit line layer 602. An upper bit line layer 606 is formed over the lower isolation layer 604. A first upper isolation layer 608 is formed over the upper bit line layer 606. A second upper isolation layer 610 is formed over the first upper isolation layer 608. A plurality of pad layers 612a-c are formed over the second upper isolation layer 610. A masking layer 614 is formed over the plurality of pad layers 612a-c. An upper surface of a third pad layer 612c is left exposed in a plurality of sacrificial regions 616, laterally offset segments of the masking layer 614. In some embodiments, the above layers may be formed using a deposition process such as, for example, chemical vapor deposition (CVD), physical vapor deposition (PVD), some other suitable deposition process(es), or any combination of the foregoing.

In some embodiments, the ILD layer 402 may, for example, be or comprise an oxide, silicon oxide, a low-k dielectric, or the like. As used herein, a low-k dielectric is a dielectric material with a dielectric constant less than 3.9. The metal etch stop layer 404 may, for example, be or comprise silicon carbide, silicon nitride, or the like. The lower bit line layer 602 may, for example, be or comprise tungsten. The lower isolation layer 604 may, for example, be or comprise an oxide, silicon oxide, a low-k dielectric, or the like. The upper bit line layer 606 may, for example, be or comprise tungsten. In some embodiments, the lower bit line layer 602 is a same material (e.g., tungsten) as the upper bit line layer 606. The first upper isolation layer 608 may, for example, be or comprise silicon oxide, silicon nitride, aluminum oxide, or the like. The second upper isolation layer 610 may, for example, be or comprise an oxide, silicon oxide, a low-k dielectric, or the like. A first pad layer 612a may, for example, be or comprise nitride, silicon nitride, or the like. A second pad layer 612b may, for example, be or comprise an oxide, silicon oxide, or the like. The third pad layer 612c may, for example, be or comprise a nitride, silicon nitride, or the like. The masking layer 614 may, for example, be or comprise a hard mask layer, silicon oxide, silicon oxynitride, or the like.

Figure 7:
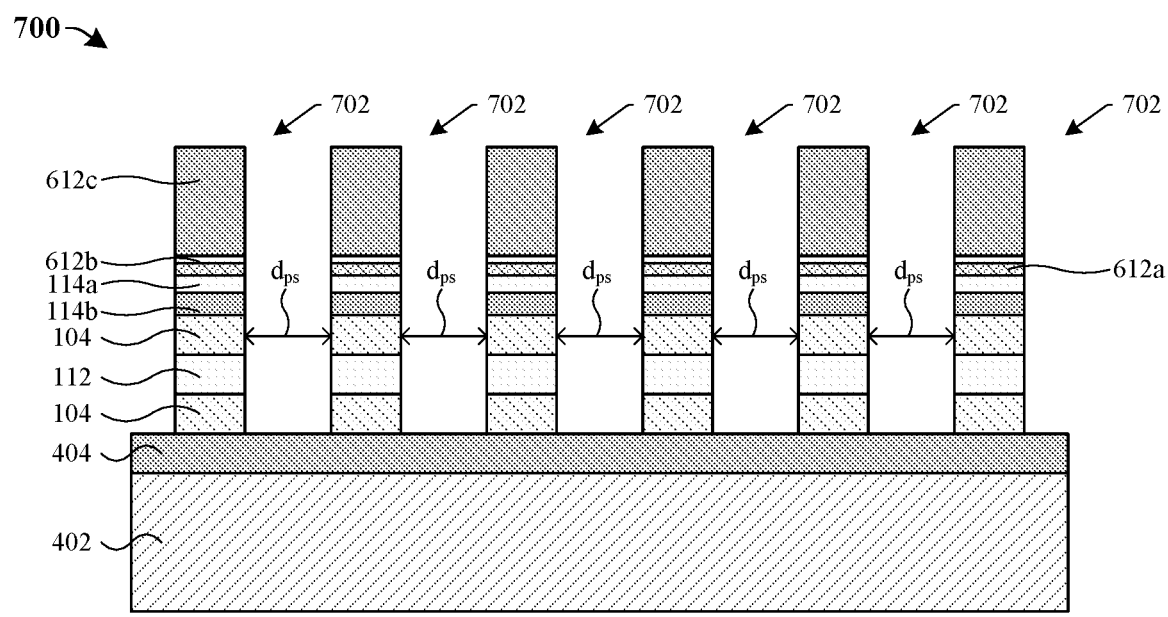

As shown in cross-sectional view 700 of FIG. 7, an etching process is performed to etch the third pad layer 612c and layers underlying the third pad layer 612c, defining 6 pillar structures 702. The etching process is performed by exposing the layers underlying the third pad layer 612c within the sacrificial regions (616 of FIG. 6) to one or more etchants. The etching process may, for example, be performed by a photolithography/etching process and/or some other suitable patterning process(es). In various embodiments, the etching process may comprise a single etch (i.e., a continuous etch that etches the plurality of pad layers 612a-c, the first and second upper isolation layers (608, 610 of FIG. 6), the upper bit line layer (606 of FIG. 6), the lower isolation layer (604 of FIG. 6), and the lower bit line layer (602 of FIG. 6)) or multiple etches performed in-situ. Etching the first and second upper isolation layers (608, 610 of FIG. 6), the upper bit line layer (606 of FIG. 6), the lower isolation layer (604 of FIG. 6), and the lower bit line layer (602 of FIG. 6) define first and second isolation layers 114a, 114b, bit lines 104, and a lower isolation structure 112. In some embodiments, the etching process defines twelve bit lines 104. In yet further embodiments, the pillar structures 702 are separated from one another by a lateral distance $d_{ps}$. The lateral distance $d_{ps}$ may, for example, be within a range of about 40 to 100 nanometers.

Figure 8:
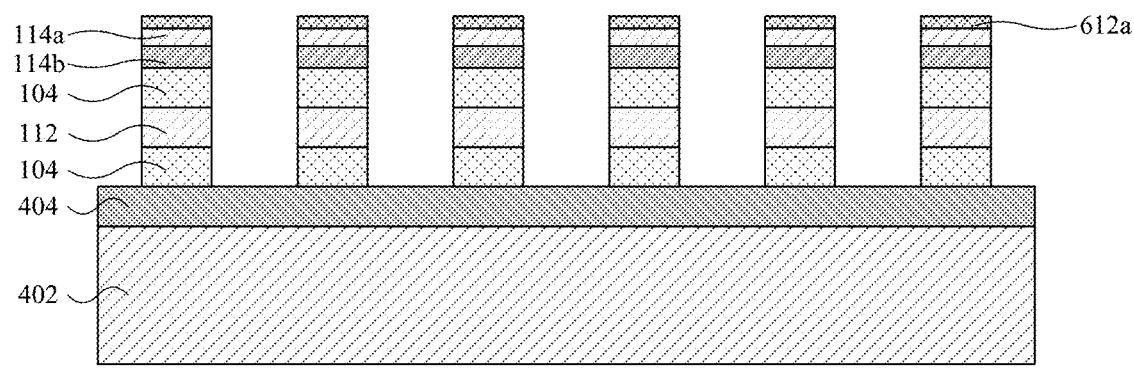

As shown in cross-sectional view 800 of FIG. 8, a removal process is performed to remove the first second and third pad layers (612b, 612c of FIG. 7). In some embodiments, the removal process may comprise a photolithography/etching process and/or a planarization process (e.g., a chemical mechanical planarization (CMP) process) to expose an upper surface of the first pad layer 612a.

Figure 9:
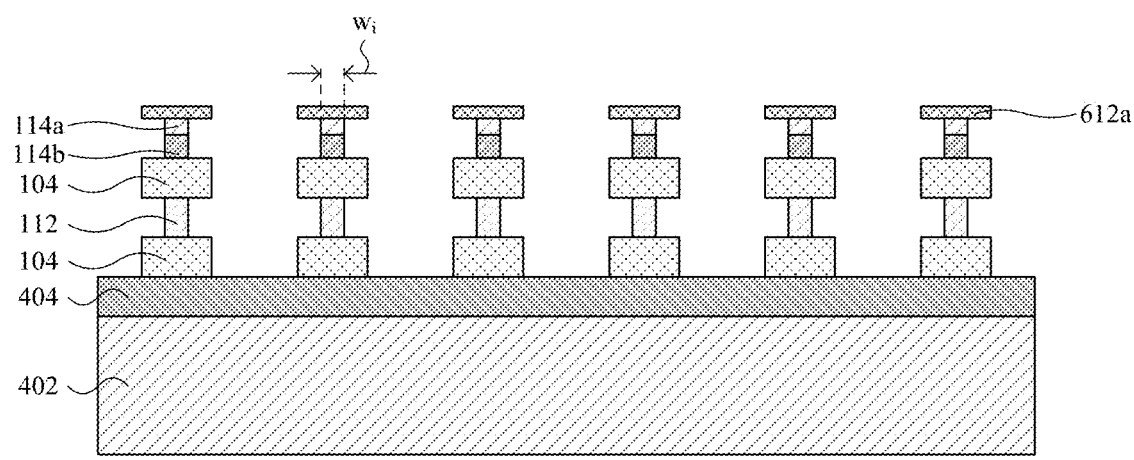

As shown in cross-sectional view 900 of FIG. 9, a lateral etch process is performed to reduce a width of the first and second upper isolation layers 114a, 114b and the lower isolation structure 112. In some embodiments, the lateral etch process reduces a width $w_t$ of the first and second upper isolation layers 114a, 114b and the lower isolation structure 112 by approximately 5 to 40 nanometers. The lateral etch process may, for example, comprise a wet etch process.

Figure 10:
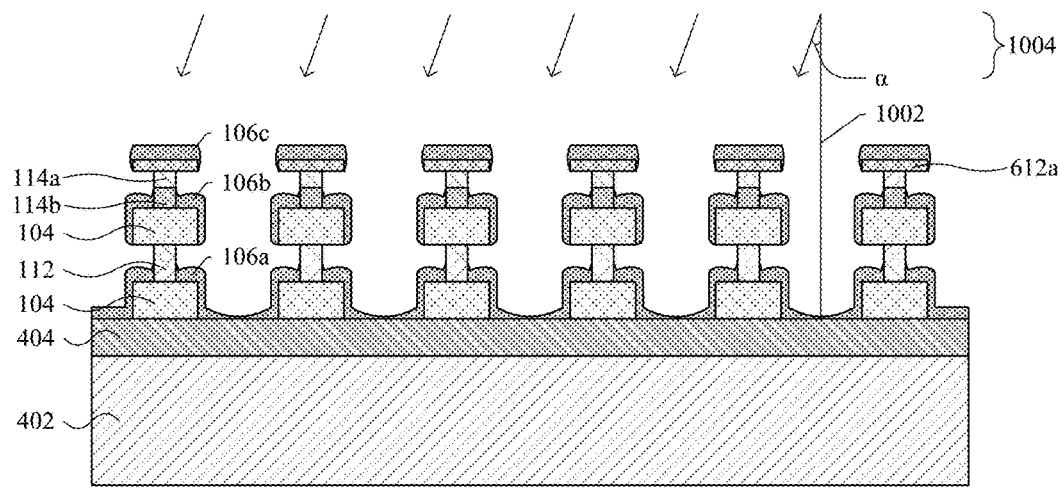

As shown in cross-sectional view 1000 of FIG. 10, conductive scavenger layers 106a-c are deposited on the bit lines 104 and the first pad layer 612a. The conductive scavenger layers 106a-c may, for example, respectively be or comprise titanium nitride, or the like. The deposition process may, for example, comprise a physical vapor deposition (PVD) process of a conductive scavenger material 1004 (e.g., titanium nitride) at an angle α. The angle α is defined from a substantially straight vertical line 1002, such that the vertical line 1002 is perpendicular to a top surface of the metal etch stop layer 404 and/or perpendicular to a top surface of an underlying semiconductor substrate (not shown). In some embodiments, the angle α is within a range of about −45 to −10 degrees and/or 10 to 45 degrees. The angle α is configured to mitigate formation of the conductive scavenger material 1004 on a bottom surface of each bit line 104, such that the bottom surface of each bit line 104 is shielded from the deposition of the conductive scavenger material 1004.

Figure 11:
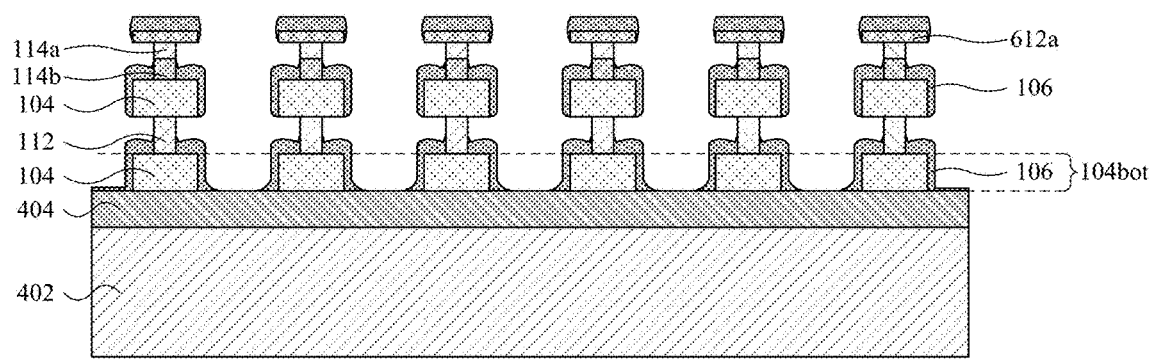

As shown in cross-sectional view 1100 of FIG. 11, an etching process is performed to remove a portion of the conductive scavenger layers 106a-c, thereby defining a scavenger layer 106 over and around each bit line 104. In some embodiments, the etching process is a directional dry etching process. The etching process may, for example, be configured to electrically isolate a bottommost layer of bit lines 104bot from one another by removing a portion of a bottommost conductive scavenger layer (106a of FIG. 10) between the bit lines 104 in the bottommost layer of bit lines 104bot.

Figure 12:
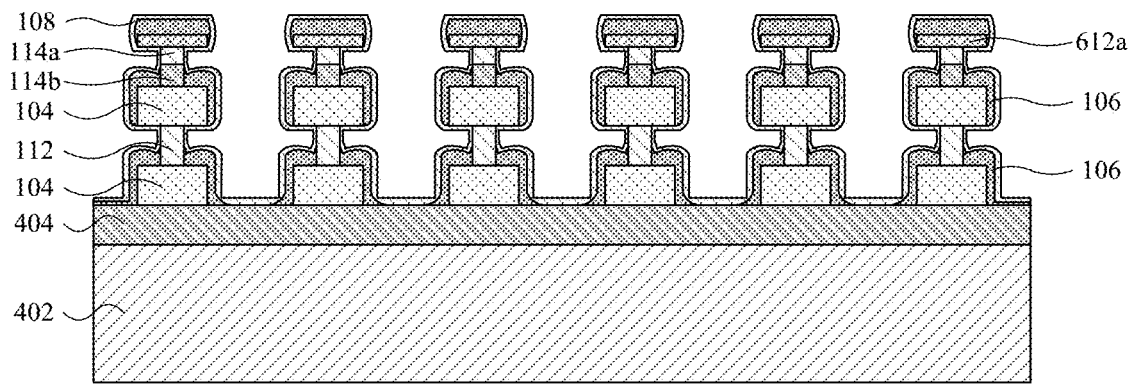

As shown in cross-sectional view 1200 of FIG. 12, a data storage layer 108 is formed over the scavenger layer 106, the metal etch stop layer 404, the lower isolation structure 112, and the first and second upper isolation layers 114a, 114b. In some embodiments, the data storage layer 108 is formed by atomic layer deposition (ALD). The data storage layer 108 may, for example, be or comprise an oxide (such as titanium oxide, tantalum oxide, etc.), a high-k dielectric, or the like. As used herein, a high-k dielectric is a dielectric material with a dielectric constant greater than 3.9.

Figure 13:
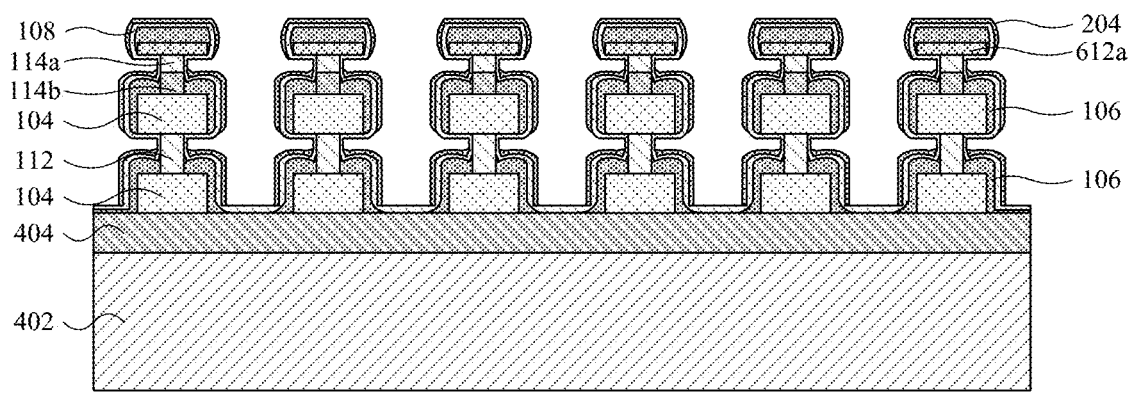

As shown in cross-sectional view 1300 of FIG. 13, an outer scavenger layer 204 is formed over and around the data storage layer 108. In some embodiments, the outer scavenger layer 204 may, for example, be or comprise titanium nitride, or the like. The outer scavenger layer 204 may, for example, be formed with a same or similar process as described in FIGS. 10 and 11, such that the outer scavenger layer 204 is formed in a similar manner as the scavenger layer 106.

Figure 14:
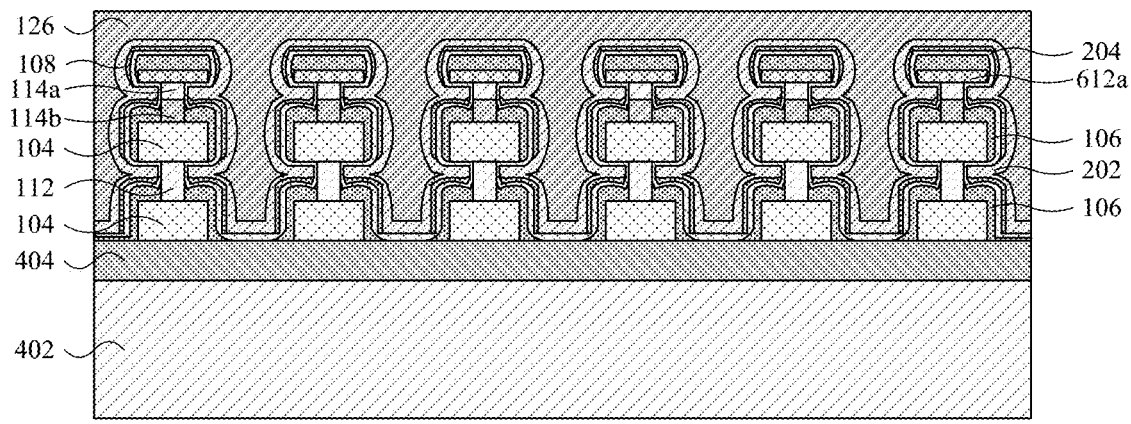

As shown in cross-sectional view 1400 of FIG. 14, a selector layer 202 is formed over the outer scavenger layer 204 and the data storage layer 108. The selector layer 202 may, for example, be or comprise a binary material such as silicon tellurium, germanium tellurium, carbon tellurium, boron tellurium, zinc tellurium, aluminum tellurium, germanium selenide, germanium antimony, selenium antimony, silicon arsenide, germanium arsenide, arsenic tellurium, boron carbide, or the like and/or may comprise N-doping, and O-doping. In further embodiments, the selector layer 202 may, for example, be or comprise a ternary compound such as germanium selenium arsenide, germanium selenium antimony, germanium antimony tellurium, germanium silicon arsenide, germanium arsenic antimony, selenium antimony tellurium, silicon tellurium selenium, or the like and/or may comprise N-doping, O-doping, and C-doping. In yet further embodiments, the selector layer 202 may, for example, be or comprise a quadruple compound such as germanium selenium arsenic tellurium, germanium selenium tellurium silicon, germanium selenium tellurium arsenide, germanium selenium arsenic antimony, germanium selenium antimony silicon, or the like and/or may comprise N-doping, O-doping, and C-doping. The selector layer 202 may, for example, comprise a compound with five elements. In some embodiments, the selector layer 202 comprises a dielectric material different than the data storage layer 108. An upper inter-metal dielectric (IMD) structure 126 is formed over the selector layer 202. The upper IMD structure 126 may, for example, be or comprise silicon oxide, a low-k dielectric, or the like. In some embodiments, the selector layer 202 and the upper IMD structure 126 may, for example, be formed by an ALD process.

Figure 15:
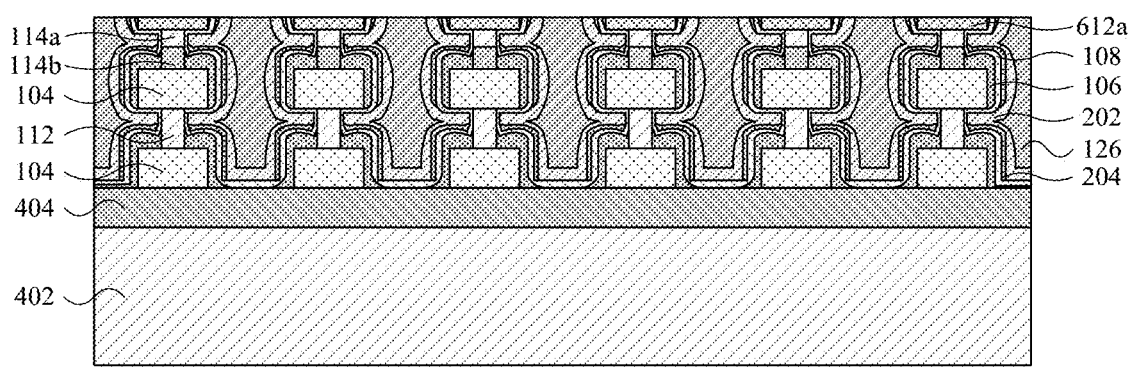

As shown in cross-sectional view 1500 of FIG. 15, a planarization process is performed on the structure of FIG. 14 until a top surface of the first pad layer 612a is exposed. The planarization process may, for example, be a CMP process.

Figure 16:
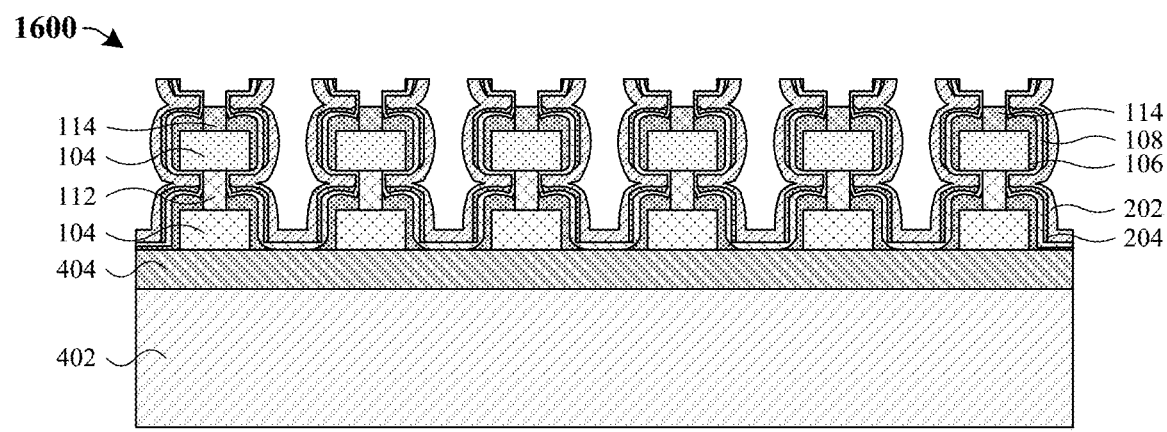

As shown in cross-sectional view 1600 of FIG. 16, an etching process is performed on the structure of FIG. 15 until a top surface of the second upper isolation layer (114b of FIG. 15) is exposed, thereby defining an upper isolation structure 114. The etching process removes a portion of the upper IMD structure (126 of FIG. 15), thereby exposing an upper surface of the selector layer 202. The etching process may, for example, be a wet etch process.

Figure 17:
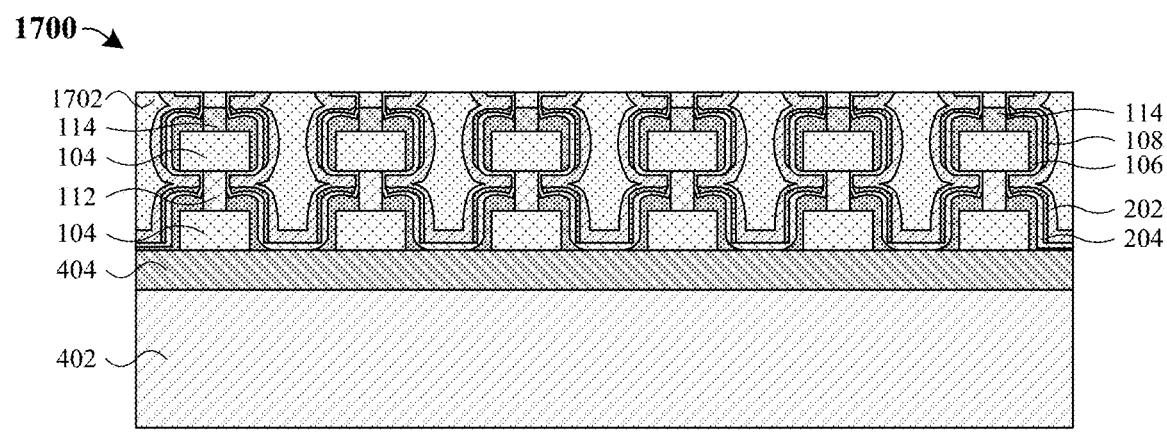

As shown in cross-sectional view 1700 of FIG. 17, a word line layer 1702 is formed over the selector layer 202 and the upper isolation structure 114. The word line layer 1702 may, for example, be or comprise tungsten, or the like. In some embodiments, a process for forming the word line layer 1702 may, for example, include forming a conductive material (e.g., tungsten) over the selector layer 202 and the upper isolation structure 114, then subsequently performing a planarization process (e.g., a CMP process) into the conductive material until reaching a top surface of the selector layer 202.

Figure 18:
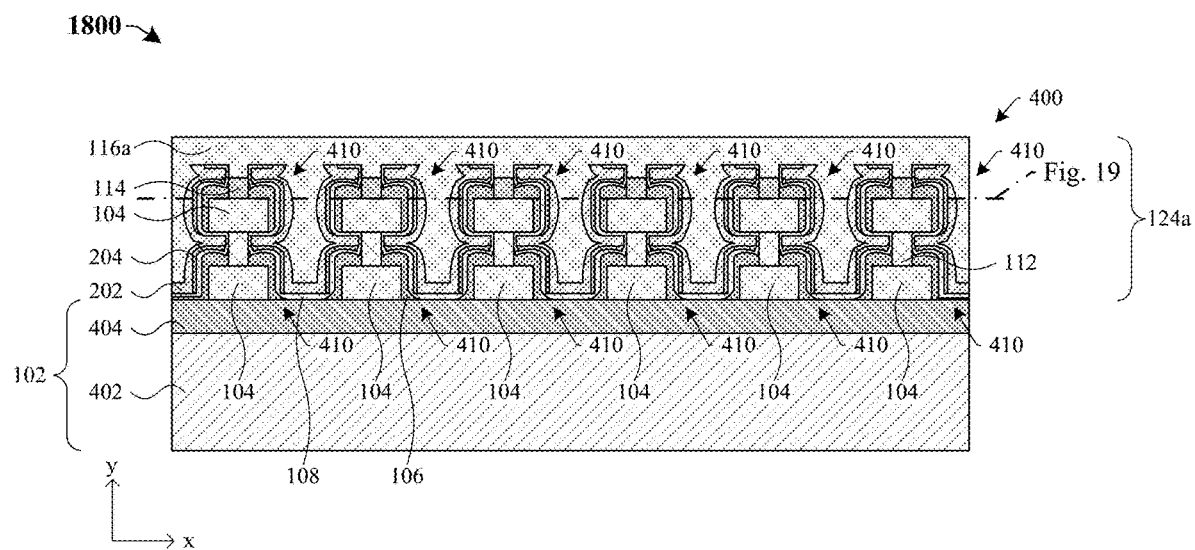

As shown in cross-sectional view 1800 of FIG. 18, conductive word line material (e.g., tungsten) is formed over the structure of FIG. 17, thereby forming a first word line 116a. This, in part, defines a first column 124a of a memory device 400 and twelve memory cells 410.

Figure 19:
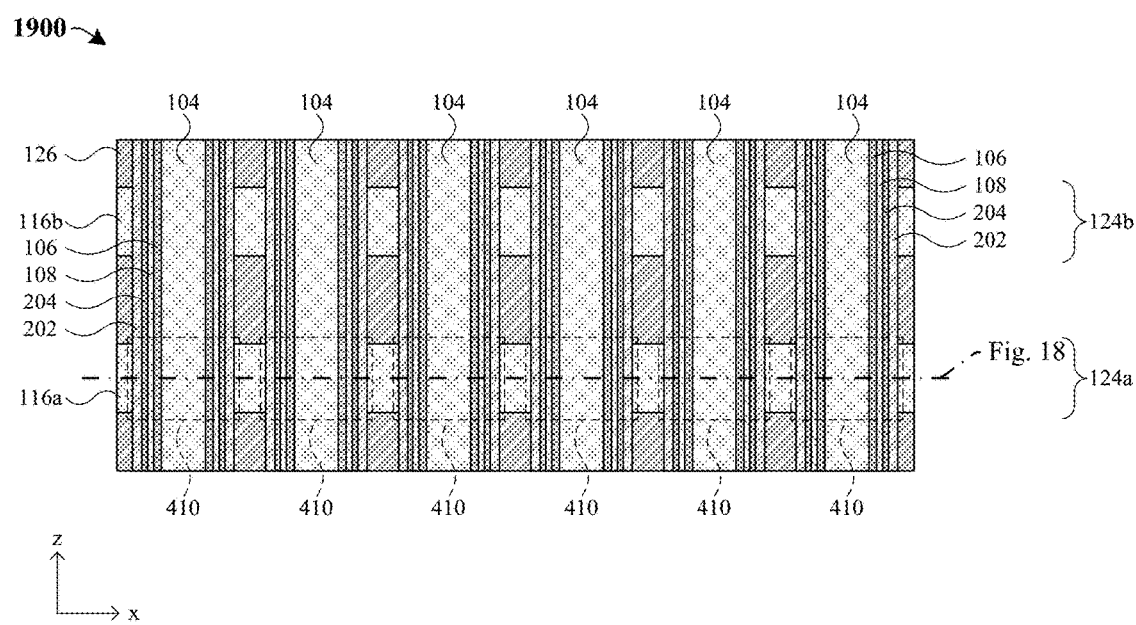

Referring to FIG. 19, a top view corresponding to some embodiments of the cross-sectional view 1800 of FIG. 18, as indicated by the cut-away lines shown in FIGS. 18-19 is provided. In some embodiments, during a formation of the first column 124a, a second column 124b may be formed concurrently. The second column 124b may, for example, be formed with a same process flow as described in the formation of the first column 124a. The bit lines 104 respectively extend in a first direction (e.g., along the z-axis), the first word line 116a and a second word line 116b respectively extend in a second direction (e.g., along the x-axis). In some embodiments, the first direction is orthogonal to the second direction. The first and second word lines 116a, 116b are laterally separated from one another by the upper IMD structure 126.

Figure 20:
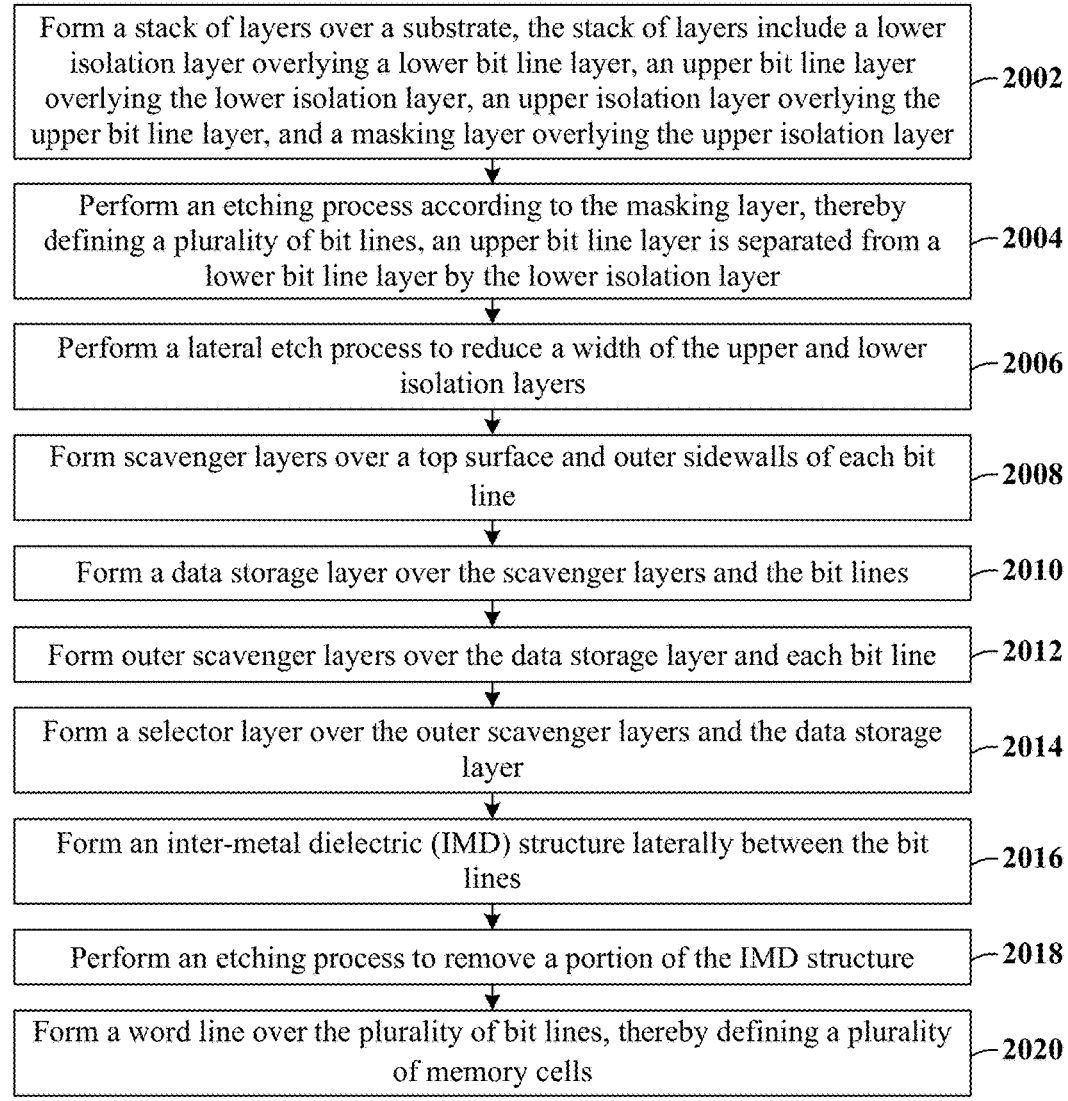
FIG. 20 illustrates a methodology in flowchart format that illustrates some embodiments of a method of forming a memory device.

FIG. 20 illustrates a method 2000 of forming a memory device in accordance with some embodiments. Although the method 2000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2002, a stack of layers is formed over a substrate. The stack of layers include a lower isolation layer overlying a lower bit line layer, an upper bit line layer overlying the lower isolation layer, an upper isolation layer overlying the upper bit line layer, and a masking layer overlying the upper isolation layer. FIG. 6 illustrates a cross-sectional view 600 corresponding to some embodiments of act 2002.

At act 2004, an etching process is performed according to the masking layer, thereby defining a plurality of bit lines, an upper bit line layer is separated from a lower bit line layer by the lower isolation layer. FIG. 7 illustrates a cross-sectional view 700 corresponding to some embodiments of act 2004.

At act 2006, a lateral etch process is performed to reduce a width of the upper and lower isolation layers. FIG. 9 illustrates a cross-sectional view 900 corresponding to some embodiments of act 2006.

At act 2008, scavenger layers are formed over a top surface and outer sidewalls of each bit line. FIGS. 10 and 11 illustrate cross-sectional views 1000 and 1100 corresponding to some embodiments of act 2008.

At act 2010, a data storage layer is formed over the scavenger layers and the bit lines. FIG. 12 illustrates a cross-sectional view 1200 corresponding to some embodiments of act 2010.

At act 2012, outer scavenger layers are formed over the data storage layer and each bit line. FIG. 13 illustrates a cross-sectional view 1300 corresponding to some embodiments of act 2012.

At act 2014, a selector layer is formed over the outer scavenger layers and the data storage layer. FIG. 14 illustrates a cross-sectional view 1400 corresponding to some embodiments of act 2014.

At act 2016, an inter-metal dielectric (IMD) structure is formed laterally between the bit lines. FIG. 14 illustrates a cross-sectional view 1400 corresponding to some embodiments of act 2016.

At act 2018, an etching process is performed to remove a portion of the IMD structure. FIG. 16 illustrates a cross-sectional view 1600 corresponding to some embodiments of act 2018.

At act 2020, a word line is formed over the plurality of bit lines, thereby defining a plurality of memory cells. FIGS. 17 and 18 illustrate cross-sectional views 1700 and 1800 corresponding to some embodiments of act 2020.

Accordingly, in some embodiments, the present disclosure relates to a horizontal memory array including a scavenger layer around an upper surface and sidewalls of a bit line configured to "scavenge" (i.e., collect, absorb, and/or store) oxygen from an adjacent data storage layer and direct an electric field around the bit line.

In some embodiments, the present application provides a resistive random access memory (RRAM) device including a bit line overlying a semiconductor substrate; a data storage layer around outer sidewalls and a top surface of the bit line; a word line overlying the data storage layer; and a scavenger layer between the word line and the bit line, wherein a bottom surface of the scavenger layer is aligned with a bottom surface of the bit line, wherein a lateral thickness of the scavenger layer is less than a vertical thickness of the scavenger layer.

In some embodiments, the present application provides a memory device including a bit line overlying a substrate; a word line overlying the bit line; a data storage layer between the word line and the bit line, wherein a conductive filament is selectively formable within the data storage layer between the bit line and the word line; and a scavenger layer between the word line and the bit line, wherein the scavenger layer is configured to confine the conductive filament to an upper region of the data storage layer such that the upper region is above a top surface of the bit line, wherein a vertical thickness of the scavenger layer is greater than a lateral thickness of the scavenger layer, and wherein the vertical thickness is defined above a top surface of the bit line.

In some embodiments, the present application provides a method for manufacturing a memory device, including depositing an upper bit line over a lower bit line, wherein a lower isolation structure is formed directly between the upper and lower bit lines; depositing scavenger layers around and over the upper bit line and the lower bit line; depositing a data storage layer over the upper bit line, the lower bit line, and the lower isolation layer; depositing an inter-metal dielectric (IMD) structure around the upper and lower bit lines; patterning a portion of the IMD structure; and depositing a word line over the upper bit line such that a bottom surface of the word line is below a top surface of the lower bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) device comprising:
   a bit line overlying a semiconductor substrate;
   a data storage layer around outer sidewalls and a top surface of the bit line;
   a word line overlying the data storage layer;
   a scavenger layer between the word line and the bit line, wherein a bottom surface of the scavenger layer is aligned with a bottom surface of the bit line, wherein a lateral thickness of the scavenger layer is less than a vertical thickness of the scavenger layer; and
   an isolation structure overlying the bit line, wherein the data storage layer and the scavenger layer directly contact outer sidewalls of the isolation structure.

2. The RRAM device according to claim 1, wherein the scavenger layer is configured to collect a reactive species from the data storage layer.

3. The RRAM device according to claim 1, wherein a bottom surface of the word line extends below the top surface of the bit line, and wherein the data storage layer is disposed directly between the word line and the isolation structure.

4. The RRAM device according to claim 1, wherein the scavenger layer is configured to direct a maximum electric field between the bit line and the word line to an upper region, the upper region is defined between the top surface of the bit line and an inner surface of the word line.

5. The RRAM device according to claim 4, further comprising:
   an outer scavenger layer directly between the data storage layer and the word line, wherein the outer scavenger layer comprises a same material as the scavenger layer.

6. The RRAM device according to claim 5, wherein a top surface of the outer scavenger layer is above a top surface of the scavenger layer.

7. The RRAM device according to claim 1, wherein the bit line and the word line each comprise tungsten, the scavenger layer comprises titanium nitride, and the data storage layer comprises hafnium oxide, titanium oxide, or tantalum oxide.

8. The RRAM device according to claim 1, wherein a bottom surface of the isolation structure directly contacts the top surface of the bit line.

9. A memory device comprising:
   a bit line overlying a substrate;
   a word line overlying the bit line;
   a data storage layer between the word line and the bit line, wherein a conductive filament is selectively formable within the data storage layer between the bit line and the word line; and
   a scavenger layer between the word line and the bit line, wherein the scavenger layer is configured to confine the conductive filament to an upper region of the data storage layer such that the upper region is above a top surface of the bit line, wherein a vertical thickness of the scavenger layer is greater than a lateral thickness of the scavenger layer, wherein the lateral thickness is defined along a sidewall of the bit line, and wherein the vertical thickness is defined at a position vertically above the top surface of the bit line.

10. The memory device according to claim 9, wherein the data storage layer extends from a bottom surface of the bit line to a point above the top surface of the bit line.

11. The memory device according to claim 9, wherein the vertical thickness of the scavenger layer is at least 1.2 times greater than the lateral thickness of the scavenger layer.

12. The memory device according to claim 9, wherein the scavenger layer is directly between the data storage layer and the bit line.

13. The memory device according to claim 12, further comprising:
   another scavenger layer between the data storage layer and the bit line, wherein the another scavenger layer is configured to confine the conductive filament to the upper region.

14. The memory device according to claim 13, wherein outer sidewalls of the scavenger layer are laterally between outer sidewalls of the another scavenger layer.

15. The memory device according to claim 9, further comprising:
   a selector layer disposed between the word line and the bit line, wherein a maximum thickness of the selector layer is at least twice a maximum thickness of the data storage layer.

16. The memory device according to claim 9, wherein the bit line and the word line comprise tungsten and the scavenger layer comprises titanium nitride.

17. A memory device comprising:
   a first bit line overlying a substrate;
   a second bit line overlying the first bit line;
   a word line overlying the first and second bit lines;
   a data storage layer between the word line and the first and second bit lines, wherein a first conductive filament is selectively formable within the data storage layer between the first bit line and the word line, and a second conductive filament is selectively formable within the data storage layer between the second bit line and the word line;
   a first scavenger layer disposed between the word line and the first bit line, wherein a bottom surface of the first scavenger layer is aligned with a bottom surface of the data storage layer;
   a second scavenger layer disposed between the word line and the second bit line, wherein a bottom surface of the second scavenger layer is disposed above a top surface of the first scavenger layer; and
   wherein the first and second scavenger layers are configured to collect a reactive species from the data storage layer.

18. The memory device of claim 17, further comprising:
   a lower isolation structure disposed vertically between the first bit line and the second bit line; and
   wherein the data storage layer extends continuously from opposing sidewalls of the first bit line, along opposing sidewalls of the lower isolation structure, to a point above the second scavenger layer.

19. The memory device of claim 17, wherein the first scavenger layer continuously extends along opposing sidewalls of the first bit line and a top surface of the first bit line, wherein a lateral thickness of the first scavenger layer is less than a vertical thickness of the first scavenger layer.

20. The memory device of claim 17, wherein outer opposing sidewalls of the first bit line are aligned with outer opposing sidewalls of the second bit line.

* * * * *